(12) United States Patent
Chan

(10) Patent No.: US 6,946,881 B1
(45) Date of Patent: Sep. 20, 2005

(54) METHOD TO DETECT THE POLARITY OF SYNC SIGNALS WITHOUT EXTERNAL CAPACITOR OR CLOCK

(75) Inventor: Wai Cheong Chan, Sunnyvale, CA (US)

(73) Assignee: National Semiconductor Corporation, Santa Clara, CA (US)

(*) Notice: Subject to any disclaimer, the term of this patent is extended or adjusted under 35 U.S.C. 154(b) by 255 days.

(21) Appl. No.: 10/171,571

(22) Filed: Jun. 14, 2002

(51) Int. Cl.[7] .............................................. G01R 19/00
(52) U.S. Cl. ...................................................... 327/28
(58) Field of Search ........................ 327/22–31, 17–20, 327/36, 47–49, 13–15, 44, 170–176; 340/146.2

(56) References Cited

U.S. PATENT DOCUMENTS

| | | | | |
|---|---|---|---|---|
| 4,031,532 A | * | 6/1977 | First ............................ 341/157 |
| 4,360,767 A | * | 11/1982 | Akiyama et al. ............ 388/811 |
| 4,603,324 A | * | 7/1986 | Hu ............................ 340/384.5 |
| 5,257,287 A | * | 10/1993 | Blumenthal et al. ......... 375/292 |
| 5,297,869 A | * | 3/1994 | Benham ....................... 375/361 |
| 5,831,455 A | * | 11/1998 | Chen ............................ 327/28 |
| 6,285,172 B1 | * | 9/2001 | Torbey ......................... 323/237 |

* cited by examiner

Primary Examiner—My-Trang Nu Ton
(74) Attorney, Agent, or Firm—Jurgen Vollrath

(57) ABSTRACT

In a polarity detector circuit for detecting the polarity of monitor sync signals, a clock generator and counter circuit are provided to count clock cycles during the positive and negative portions of the signal. Comparators are used to compare the counter values to predetermined values to determine when one or both of the counters has reached a predefined value. With the proper choice of sampling clock, this digital implementation can be easily optimized for small size and simplicity.

20 Claims, 5 Drawing Sheets

METHOD TO DETECT THE POLARITY OF SYNC SIGNALS WITHOUT EXTERNAL CAPACITOR OR CLOCK

FIELD OF THE INVENTION

The invention relates to a method and circuit for detecting the polarity of a signal. In particular it relates to a method and circuit for detecting the polarity of synchronization signals used by a display monitor.

BACKGROUND OF THE INVENTION

A typical image displayed on a monitor or display screen that uses a cathode ray tube to generate the image, is made up of a plurality of horizontal lines that are created to define the image. In order to synchronize the line generation and creation of subsequent pictures, synchronization (sync) signals are used. Typically a horizontal and a vertical sync signal (H-sync, and V-sync, respectively), are defined, as illustrated in FIG. 1, in which a positive polarity signal 100 and a negative polarity signal 120 are shown.

Several approaches have been used in the past to detect the polarity of H-sync and V-sync. One approach is to make use of a low pass filter, which, in its simplest form, comprises a resistor and a capacitor to ground. The capacitor will effectively charge up during the positive portion of the cycle and discharge during the negative portion of the cycle. Thus, in the case of a positive polarity signal (signal 100 in FIG. 1) in which the positive portion is less than the negative portion, the capacitor will not be charged to a "high" level. while a negative polarity signal (signal 102 in FIG. 1) will charge up to a "high" level. However, the frequency range of these signals is quite low (typically in the kHz range for H-sync, and in the Hz range for V-sync). Thus, the capacitor used in such a filter approach has to be quite large (of the order of $\mu F$ for H-sync). Due to the size of the capacitor that would be needed, it is unrealistic to integrate the capacitor structure on a semiconductor chip. Accordingly, an external capacitor has to be used, with a chip pin to the external capacitor. The need for discrete devices in implementing the solution therefore increases the cost, implementation effort and size.

Another approach has been to make use of a digital implementation that avoids the need for a capacitor. However this typically relies on a system clock, thus requiring one or more pins on the chip for connecting to an external clock or crystal. Thus, again external components are required.

The present invention proposes a method of detecting the polarity of sync signal that avoids the need for external components.

SUMMARY OF THE INVENTION

The present invention provides a method and circuit for detecting the polarity of a signal that makes use of a clock generator to generate clock pulses, and a polarity detector for detecting the average polarity of a signal, wherein the polarity detector includes a counting circuit for counting the number of clock pulses during positive portions of the signal, and the number of clock pulses during the negative portion of the signal. The polarity detector may include a first counter for counting the clock pulses generated during the positive portion of the signal, and a second counter for counting the clock pulses generated during the negative portion of the signal, and comparator circuitry for comparing the counter values. The comparator circuitry may comprise a first comparator for comparing the output from the first counter to at least one predefined value, and a second comparator for comparing the output from the second counter to at least one predefined value. The first counter may be configured to count up during the positive portion of the signal and count down during the negative portion of the signal, and the second counter may be configured to count up during the negative portion of the signal and count down during the positive portion of the signal. Each of the counters may be configured to generate a first signal when the counter has counted up to a first predefined value, e.g., all 1's, and a second signal when the counter has counted down to a second predefined value, e.g., all 0's. The polarity detector may be configured to generate an output signal when the first counter has counted down to the second predefined value and the second counter has a value other than zero. Preferably the polarity detector is configured to count up on the second counter only if the first counter generates a second signal, and to count up on the first counter only if the second counter generates a second signal. Fundamentally, there is no restriction on the clock frequency used. In this embodiment. the only requirement is that the counter must be able to eventually accumulate a zero value on one counter and a non-zero value on the other counter. In order to obtain the polarity in as few input cycles as possilbe and use as short a counter as possible. the sampling clock period is typically chosen such that its period is of the same order of magnitude as the shorter of the high or low portion of the signal, and preferably the clock frequency is such that at least three clock signals can be generated during the longer of the high or low portions of the signal, and so that the clock period is slightly greater than the pulse width of the signal.

The method and circuit of the invention may further include a ripple counter for slowing down the frequency of the signal from the clock generator to provide a more appropriate clock signal for the polarity detector. The clock generator may comprise a flip-flop that toggles repeatedly by using its output to clear the flip-flop. The generator thus makes use of the time delay of a signal through the flip-flop to determine the clock frequency. The clock generator may include one or more delay elements such as delay lines in one or more of the feedback loops from the output of the flip-flop.

DETAILED DESCRIPTION OF THE INVENTION

Figure 2:
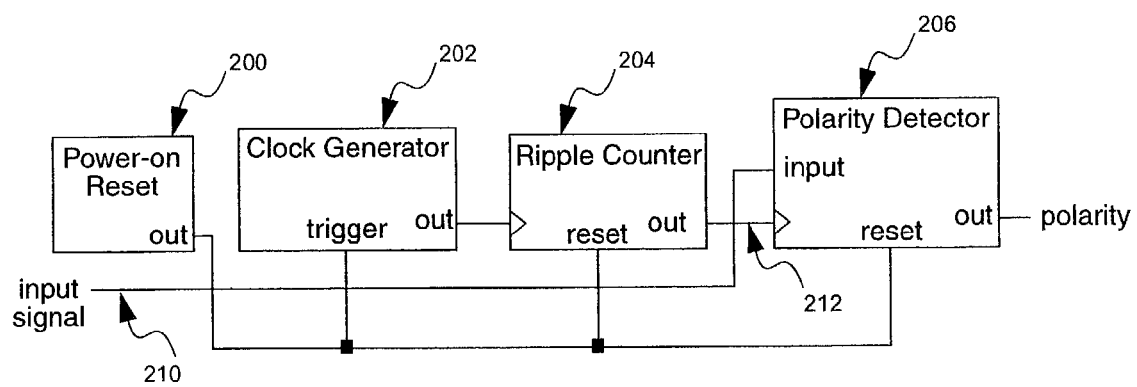
FIG. 2 is a block diagram of one embodiment of the circuit of the invention.

One embodiment of the invention is illustrated in FIG. 2. The circuit includes a power-on reset circuit 200, a clock generator 202, a ripple counter 204, and a polarity detector 206. The input signal 210, which may be either a H-sync or V-sync signal, is fed into the input of the polarity detector 206. The clock input 212 of the polarity detector 206 is, in turn obtained from the clock generator 202 via the ripple counter 204.

Figure 3:
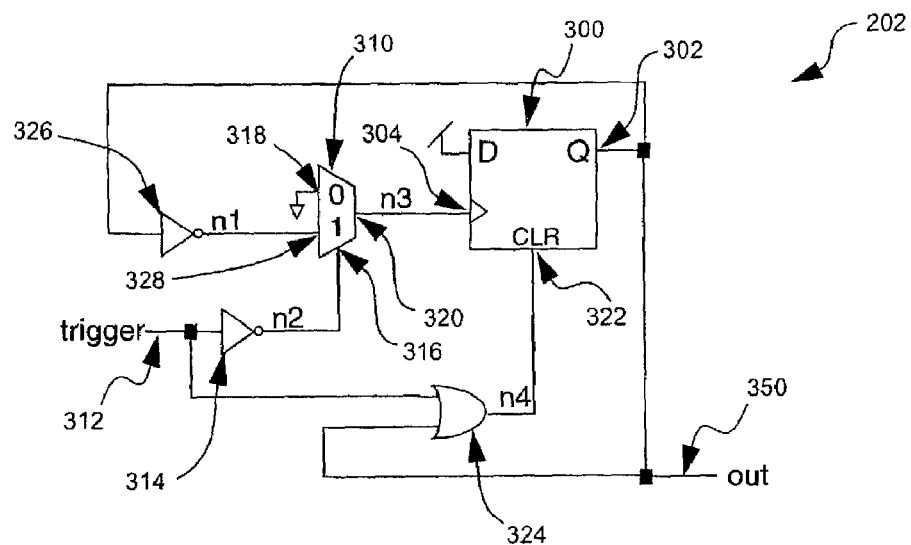
FIG. 3 is a circuit diagram of one embodiment of a clock generator used in the circuit of FIG. 2.

One embodiment of the clock generator 202 is shown in FIG. 3, and includes a flip-flop 300. The Q-output 302 of the flip-flop 300 serves to clear the flip-flop 300 and is fed back to the clock input 304 through a multiplexer 310. The operation of the clock generator 202 can best be understood with reference to the timing diagram of FIG. 4.

The clock generator 202 is triggered by a trigger signal 400, which, in this embodiment, is a high to low transition. When the trigger signal 400 (which is fed in at the trigger input 312) is high, the inverter 314 presents a low signal 402 (n2) to the select pin 316 of the multiplexer 310. Thus the "0" input 318 of the multiplexer 310 is selected and presented to the output 320 (n3) of the multiplexer 310. This forms the input signal 404 (n3) to the clock input 304 of the flip-flop 300. Also, the high trigger signal is fed to the CLR input 322 of the flip-flop 300, via an OR gate 324 to define a clear signal 406 (n4). Thus the high signal clears the flip-flop to ensure that the Q-output signal 408 (out) is low. Since the Q-output signal 408 is inverted by the inverter 326, a high signal 410 (n1) is presented to the "1" input 328 of the multiplexer 310 under these conditions. These initial pre-triggering voltage levels are shown in FIG. 4.

Figure 4:
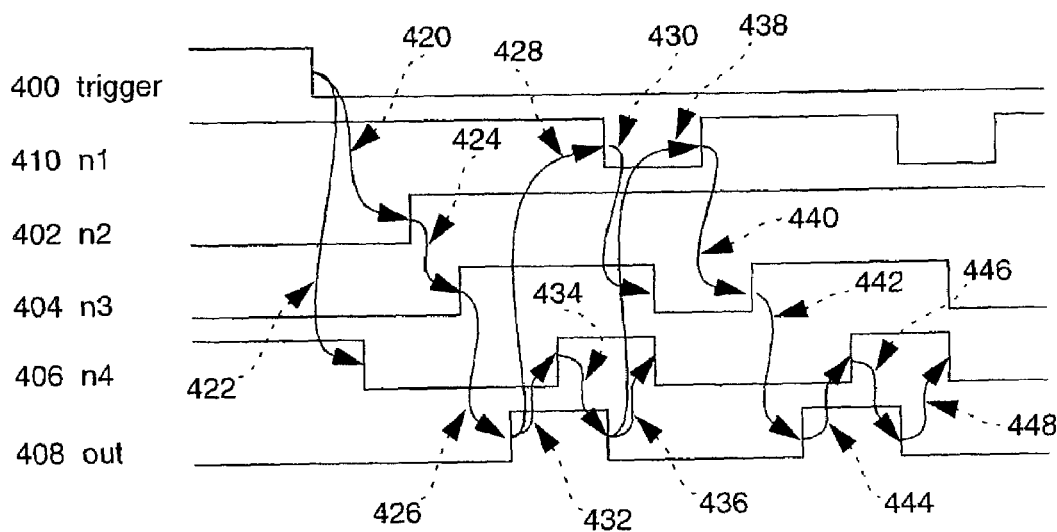
FIG. 4 is a timing diagram for the clock generator of FIG. 3.
Figure 5:
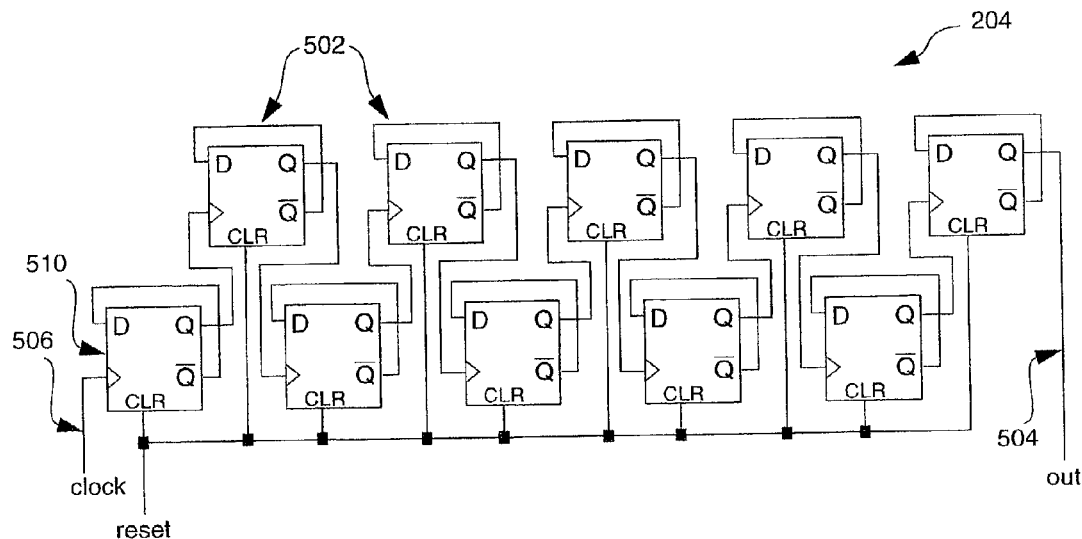
FIG. 5 is a schematic circuit diagram of one embodiment of a ripple counter of the circuit of FIG. 2.

As the trigger signal 400 transitions to low, the multiplexer select signal 402 (n2) goes high as shown by the arrow 420 in FIG. 4. Also, clear signal 406 (n4) goes low (arrow 422). The slight time delay is due to the propagation delay through the inverter 314 and the OR gate 324, respectively. Since the multiplexer 320 now selects the "1" input, the high n1 signal is presented to the output 320 of the multiplexer as shown by signal 404 (n3) going high (arrow 424). This clocks the flip-flop 300 so that the D-input, which is tied high, appears at the output 302 as output signal 408 (arrow 426).

The output from the flip-flop is fed back to the clock input through the inverter 326 causing signal 410 (n1) to go low (arrow 428). Since the select input 316 of the multiplexer 320 is still being held high by the low trigger signal, input "1" (which is now low) continues to be presented to the output 320 of the multiplexer 310. Thus signal 404 (n3) goes low (arrow 430). Furthermore, when the output signal 408 goes high, it is fed back to the CLR input 322 via the OR-gate 324. Thus signal 406 (n4) goes high (arrow 432) to clear the flip-flop as is shown in FIG. 4 by the output signal 408 going low (arrow 434). The output from the flip-flop 300 is again fed back to the CLR input, causing signal 406 (n4) to again go low (arrow 436). The output signal 408 is also fed back through inverter 326 to cause signal 410 (n1) to go high (arrow 438). This is, in turn, again fed through to the output of the multiplexer 310 causing signal 404 (n3) to go high (arrow 440). Signal 404 again triggers the flip-flop 300 to cause the output signal 408 to go high (arrow 442). The output signal 408 is again fed back to the CLR input, causing signal 406 (n4) to go high (arrow 444) and clear the flip-flop 300. Thus the output signal 408 from the flip-flop 300 goes low (arrow 446), causing the signal 406 (n4) to the CLR input 322 to go low (arrow 448).

Thus the clock generator 202 generates a continuous pulse train. In order to ensure the proper signal switching, the timing may have to be adjusted for the "1" input 328, the select input 316, and the feedback from the Q-output 302 to the OR-gate 324.

In order to provide a suitable clock frequency, the embodiment of FIG. 2 makes use of a ripple counter 204 to divide the output 350 from the clock generator 202 to a lower frequency. A typical H-sync signal will have a frequency range of 25 kHz to 120 kHz, with a pulse width (the shorter of the low or high portion of the signal) of between 0.8 μs and 30% of the signal period. A typical V-sync signal, in turn will have a frequency range of 50 Hz to 90 Hz, with a pulse width of between 28 μs and 25% of the signal period. As will become clearer from the discussion of the polarity detector 206 below, unnecessary long up and down counting can be avoided by providing a clock period that is of the same order of magnitude as the pulse (the shorter of the high or low portions of the synchronization signal).

In the ripple counter 204, 10 flip-flops 502 are used to introduce a 10-flip-flop delay. It will be appreciated that as the number of flip-flops (are) is increased, the delay will increase and the frequency of the output clock signal at the output 504 will decrease. The input clock signal, which is fed into the input 506 from the clock generator 202, clocks the first flip-flop 510. Each of the flip-flops 502 is configured to toggle by feeding back the inverted Q-output back to the input. The non-inverted Q-output is, in turn used to clock the next flip-flop 502. Thus the output 504 provides a signal that is delayed by the number of flip-flops 502 in the ripple counter 204.

It will be appreciated that the frequency of the clock signal could be adjusted in different ways instead of using a ripple counter. For instance, delay lines could be built into the clock generator 202.

Figure 6:
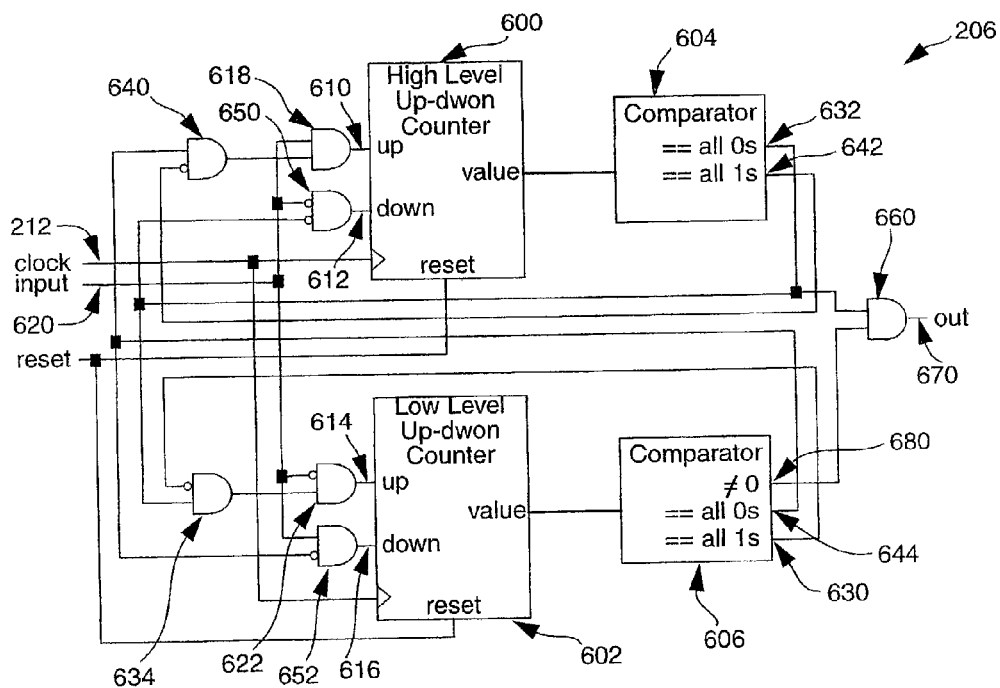
FIG. 6 is a schematic circuit diagram of one embodiment of a polarity detector of the circuit of FIG. 2.

In order to count the number of clock cycles during the high and low portions of the sync signal, a polarity detector 206 is used. One embodiment of a polarity detector 206 is shown in FIG. 6. The detector 206 includes a first counter 600 and a second counter 602, each of which can count both up and down. The first counter 600 serves to count clock cycles during the high portion of the sync signal while the second counter 602 counts clock cycles during the low portion of the sync signal. In both cases, however, the counter only counts up if the other counter has counted down to a predefined lower limit. Thus, the first counter 600 will count up during the positive portion of the sync signal and down during the negative portion, however it will not count up beyond a predefined upper limit or down beyond a predefined lower limit. Similarly, the second counter 602 will count up during the negative portion of the sync signal and down during the positive portion, however it will not count up beyond a predefined upper limit or down beyond a predefined lower limit. The limits are set by a first comparator 604 for the first counter 600, and a second comparator 606 for the second counter 602. In this embodiment, the upper limit for each comparator is set at all 1's and the lower limit at all 0's.

At power up, both counters 600, 602 are reset by a signal from the power-on reset circuit 200. The clock signal from the ripple counter 204 is fed into the clock input 212 to cause the counters to count up or down depending on the state of the select inputs. A positive signal on the up-select 610 causes counter 600 to count up while a positive signal on the down-select 612 causes the counter 600 to count down. Similarly, a positive signal on the up-select 614 causes counter 602 to count up while a positive signal on the down-select 616 causes the counter 602 to count down. In both cases, once the counter has counted up to the predefined upper limit (all 1's, in this embodiment), the counter does not wrap around.

One of the counters starts counting when the first low-to-high transition on the clock input 212 has been detected. The sync signal is fed into the data input 620 and is connected to the up-selects 610, 614 through logic that ensures that only one counter counts up at any one time and only when the other counter is at all 0's.

By connecting the signal 620 to a non-inverted input of an AND gate 618 and an inverted input of an AND gate 622, the first counter only counts up during the positive portion of the sync signal, while the second counter 602 only counts up during the negative portion of the sync signal.

Considering the second counter: the other input to the AND gate 622 has to be asserted as well to provide a high up-select signal. This happens only while the second comparator 606 has not detected all 1's and therefore its output 630 has not gone high. Also first comparator 604 must have detected all 0's and gone high on its output 632. These two requirements are met by feeding the output 632 from the first comparator 604 and the output 630 from the second comparator 606 into a non-inverted and an inverted input of an AND gate 634, respectively.

The first counter 600, in turn, only counts up when the other input to the AND gate 618 is also asserted. This happens when the inverted input of AND gate 640 has not yet received a high signal from the all-1's output 642 from the first comparator 604, and when the all-0's output 644 of the comparator 606 has issued a high signal to indicate that counter 602 is at zero.

In order for the first counter 600 to count down, a negative portion of the sync pulse must be received and the first comparator 604 must not have issued a high signal on its output 632 to indicate that the first counter 600 has counted down to all 0's. This is achieved by connecting the sync input signal and comparator output 632 to inverted inputs of an AND gate 650.

In order for the second counter 602 to count down, a positive portion of the sync pulse must be received and the second comparator 606 must not have issued a high signal on its output 644 to indicate that the second counter 602 has counted down to all 0's. This is achieved by connecting the sync input signal to a non-inverted input of an AND gate 652, and the comparator output 644 to an inverted input of the AND gate 652.

Figure 1:
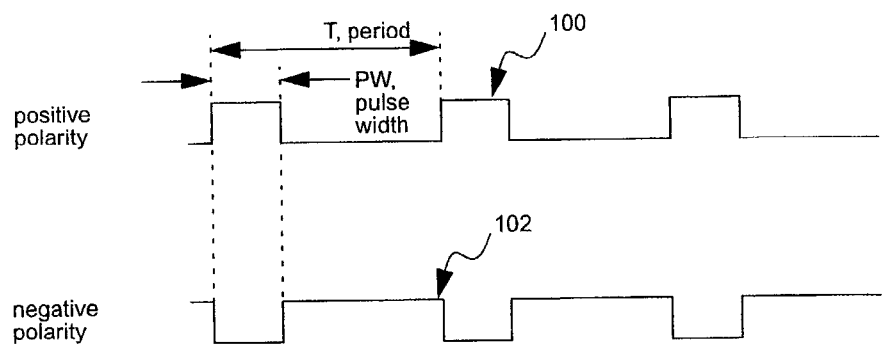
FIG. 1 is a representation of a positive polarity and a negative polarity sync signals.
Figure 8:
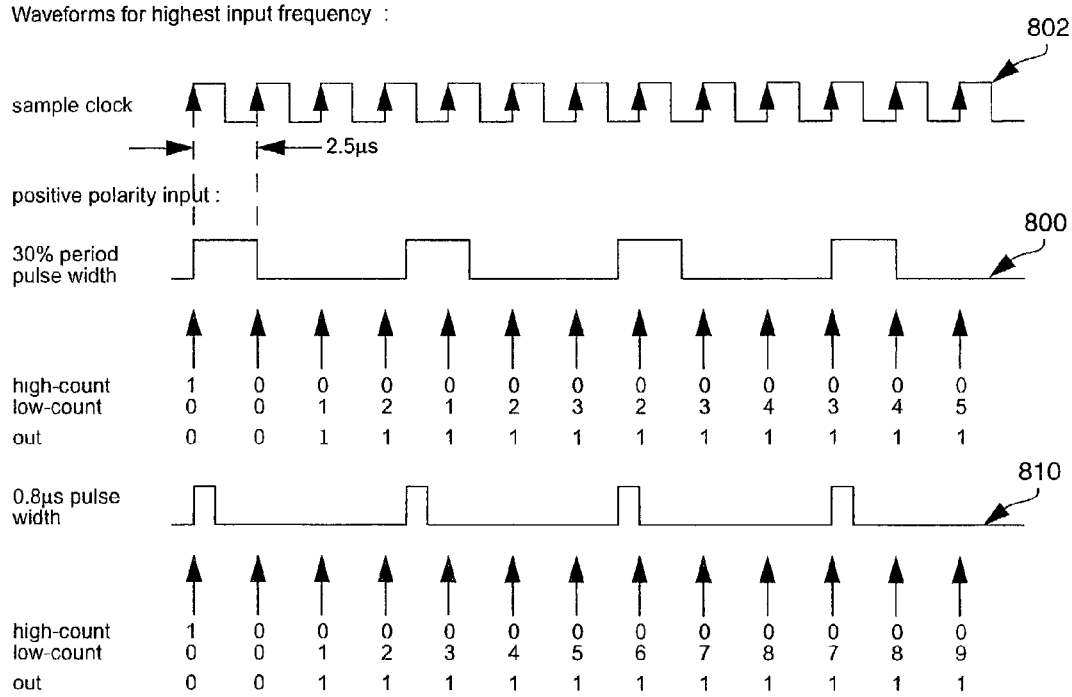
FIG. 8 shows the timing diagrams for different pulse widths for negative and positive polarity signals for H-sync.
Figure 8:
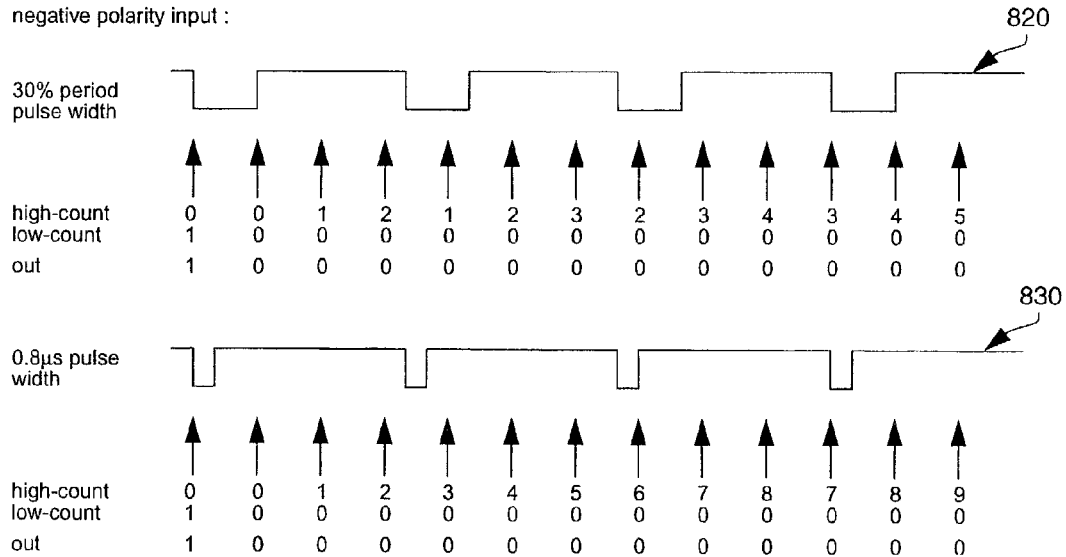

Thus only one of the counters will count up or down at any one time. For example, when all 0's has not been reached by first counter 600, as determined by first comparator 604, the second counter 602 will not count up until the first counter 600 has counted down to zero. Also, once the first counter has counted to all 1's it will not wrap around. In order to provide a high output signal for a positive polarity signal (positive pulse signal in which the low time is longer than the high time of the signal), the first comparator 604 must have counted down to all 0's while the second comparator 606 must have counted up to a non-zero value. This is achieved using an AND gate 660 that receives the all 0's output 632 from the first comparator 604, and the "≠0" output 680 from the second comparator 606. Thus output 670 only goes high when the sync signal has a negative duty cycle, otherwise it stays low. It will be appreciated that for a positive polarity (negative duty cycle) signal such as signal 100 in FIG. 1, when the signal initially goes high, the first counter 600 counts up. Then, when the signal goes low, the first counter 600 counts to all 0's before the second counter 602 counts up. This is shown in FIG. 8, which shows a positive polarity signal 800 with a pulse width just less than the clock 802 period. Thus, it will be appreciated that if the frequency of the clock was much higher than the frequency of the signal, i.e., if the clock width was very narrow compared to the duration of the negative portion of the sync signal, many clock cycles would have to be gone through to perform the counting. On the other hand, the duration of a clock cycle has to be short enough to allow the longer of the low or high portions of the sync signal (depending on whether it has a negative or a positive duty cycle) to accommodate more than two clock cycles to allow the initial counter to count back down and the subsequent counter to count up over at least two clock cycles. Furthermore, a clock period that is just greater than the pulse width ensures that the up counter (in the case of a positive polarity signal) or the down counter (in the case of a negative polarity signal) increments only once before counting down to zero during the opposite phase.

It will be recalled that a typical H-sync signal will have a frequency range of 25 kHz to 120 kHz, with a pulse width (the shorter of the low or high portion of the signal) of between 0.8 $\mu$s and 30% of the signal period. A typical V-sync signal, in turn will have a frequency range of 50 Hz to 90 Hz, with a pulse width of between 28 $\mu$s and 25% of the signal period. Thus signal 800 represents a positive polarity H-sync signal with a pulse width that is 30% of the period. Signal 810 represents a positive polarity H-sync signal with a 0.8 $\mu$s pulse width. Signal 820 represents a negative polarity H-sync signal with a pulse width that is 30% of the period. Signal 830 represents a negative polarity H-sync signal with a 0.8 $\mu$s pulse width.

It will be appreciated that the polarity detector of FIG. 6, like the other circuits, is only one embodiment of the invention. In another embodiment the polarity detector was implemented using a single up-down counter (which was preset to the mid-value of the counter on power up) with the signal input feeding into the up-select and the down-select, with the signal to the up-select being first inverted by an inverter. Thus the counter counts up during negative portions and down during positive portions of the signal. The output from the counter was fed into a comparator which compared the value to the mid-value of the counter. The output of the comparator is high if the value is higher than the mid-value of the counter (indicating positive polarity), and low if it is lower than the mid-value of the counter (indicating negative polarity).

Figure 7:
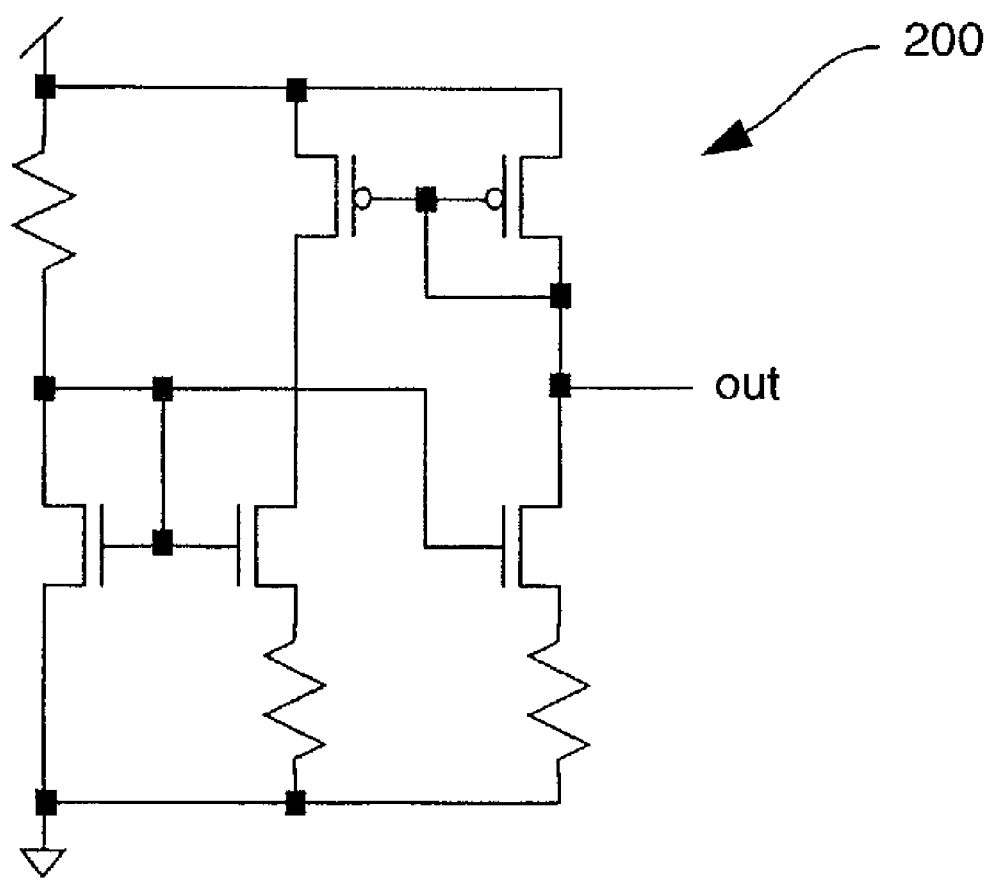
FIG. 7 is one embodiment of a power up reset circuit of the circuit of FIG. 2.

FIG. 7 shows one embodiment of a power-on reset circuit 200 as is commonly known in the art.

It will be appreciated that the various circuits of the duty cycle detection circuit of the invention can be implemented in different ways without departing from the scope of the claimed invention. Thus, for example, many other variations to the polarity detector could be implemented in order to count the number of clock cycles during the high and low portions of the sync signal and provide an output on the values obtained, either individually or compared to each other or compared to some predetermined value as was done in the embodiment discussed above with respect to FIG. 6. Also, as discussed above, the ripple counter could be eliminated altogether by appropriately providing time delays in the clock generator circuit to adjust the frequency of the clock signal. The time delays can take the form of fixed delay lines or programmable delays such as those described in co-pending application of the present applicant, entitled "Programmable non-overlap clock circuit", the contents of which are hereby incorporated herein.

What is claimed is:

1. A circuit for detecting the polarity of a repetitive signal, comprising
   a clock generator to generate clock pulses, and
   a polarity detector for detecting the average polarity of a signal, wherein the polarity detector includes a counting circuit for counting the number of clock pulses during a positive portion of the signal, and the number of clock pulses during a negative portion of the signal.

2. A circuit of claim 1, wherein the counting circuit includes a first counter for counting the clock pulses generated during the positive portion of the signal, and a second counter for counting the clock pulses generated during the negative portion of the signal, and comparator circuitry for comparing the counter values.

3. A circuit of claim 2, wherein the comparator circuitry comprises a first comparator for comparing the output from the first counter to at least one predefined value, and a second comparator for comparing the output from the second counter to at least one predefined value.

4. A circuit of claim 3, wherein the first counter is configured to count up during the positive portion of the signal and count down during the negative portion of the signal, and the second counter is configured to count up during the negative portion of the signal and count down during the positive portion of the signal.

5. A circuit of claim 3, wherein the first counter is configured to count up during the positive portion of the signal, up to a first predefined value, and count down during the negative portion of the signal, down to a second predefined value, and the second counter is configured to count up during the negative portion of the signal, up to a third predefined value, and count down during the positive portion of the signal, down to a fourth predefined value, and wherein the first counter only counts up when the second counter is at its fourth predefined value, and the second counter only counts up when the first counter is at its second predefined value.

6. A circuit of claim 5, wherein the first and third predefined values are the same, and the second and fourth predefined values are the same.

7. A circuit of claim 4, wherein the first comparator is configured to generate a first signal when the first counter has counted up to a first predefined value and a second signal when the first counter has counted down to a second predefined value, and wherein the second comparator is configured to generate a third signal when the second counter has counted up to a third predefined value and a fourth signal when the second counter has counted down to a fourth predefined value.

8. A circuit of claim 7 wherein the first and third predefined values are all 1's, and the second and fourth predefined values are all 0's.

9. A circuit of claim 8, wherein the polarity detector is configured to generate an output signal when the first counter has counted down to the second predefined value and the second counter has a counter value other than zero.

10. A circuit of claim 9, wherein the polarity detector is configured to count up on the second counter only if the first counter is at the second predefined value, and to count up on the first counter only if the second counter is at the fourth predefined value.

11. A circuit of claim 1, wherein the clock generator generates a clock pulses at a selected clock frequency, and the clock frequency from the clock generator is chosen such that its period is of the same order of magnitude as the shorter of the high or low portion of the signal.

12. A circuit of claim 11, wherein the clock frequency is such that at least three clock signals can be generated during the longer of the high or low portions of the signal.

13. A circuit of claim 12, wherein the clock period is slightly greater than the pulse width of the signal.

14. A circuit of claim 1, further comprising a ripple counter for slowing down the frequency of the signal from the clock generator to provide a slower clock signal for the polarity detector.

15. A circuit of claim 1, wherein the clock generator comprises a flip-flop that toggles repeatedly by using its output to clear the flip-flop.

16. A circuit of claim 15, wherein the generator makes use of at least the time delay of a signal through the flip-flop to determine the clock frequency.

17. A circuit of claim 16, wherein the clock generator includes one or more delay elements.

18. A circuit of claim 17, wherein the delay elements comprise a fixed delay line or programmable delay element in one or more of the feedback loops from the output of the flip-flop.

19. A circuit of claim 1, wherein the counting circuit includes a counter for counting up on the clock pulses generated during the one polarity portion of the signal, and counting down during the opposite polarity portion of the signal.

20. A circuit of claim 19, wherein the counting circuit includes a comparator to compare the output of the counter to a predefined value.

* * * * *